(12) United States Patent
Houge et al.

(10) Patent No.: US 7,972,440 B2
(45) Date of Patent: Jul. 5, 2011

(54) MONITORING AND CONTROL OF A FABRICATION PROCESS

(75) Inventors: Erik C. Houge, Orlando, FL (US); John M. McIntosh, State College, PA (US); Robert Francis Jones, Clermont, FL (US)

(73) Assignee: Agere Systems Inc., Allentown, PA (US)

( * ) Notice: Subject to any disclaimer, the term of this patent is extended or adjusted under 35 U.S.C. 154(b) by 1733 days.

(21) Appl. No.: 10/505,197

(22) PCT Filed: Feb. 24, 2003
(Under 37 CFR 1.47)

(86) PCT No.: PCT/US03/05251
§ 371 (c)(1),
(2), (4) Date: Jun. 10, 2005

(87) PCT Pub. No.: WO03/073448
PCT Pub. Date: Sep. 4, 2003

(65) Prior Publication Data
US 2006/0048697 A1    Mar. 9, 2006

Related U.S. Application Data

(60) Provisional application No. 60/359,222, filed on Feb. 22, 2002.

(51) Int. Cl.
*C30B 33/00*    (2006.01)

(52) U.S. Cl. ............ 117/201; 117/202; 117/87; 117/88; 117/94; 117/95

(58) Field of Classification Search ................. 117/201, 117/202, 94, 95, 87, 88
See application file for complete search history.

(56) References Cited

U.S. PATENT DOCUMENTS

| | | | | |
|---|---|---|---|---|
| 4,649,556 | A | * | 3/1987 | Rinik et al. ..................... 378/71 |
| 5,463,977 | A | * | 11/1995 | Manada et al. ................. 117/85 |
| 5,466,934 | A | * | 11/1995 | Adams et al. ................. 250/307 |
| 2003/0234359 | A1 | * | 12/2003 | Drown et al. ................. 250/307 |

* cited by examiner

*Primary Examiner* — Robert M Kunemund (57) ABSTRACT

A system (10) for monitoring and controlling a fabrication process includes at least a first subsystem (12), a crystallographic analysis subsystem (14), and a second subsystem (16), wherein the first subsystem and second subsystem perform respective fabrication steps on a workpiece. The crystallographic analysis subsystem may be coupled to both the first subsystem and second subsystem. The analysis subsystem acquires crystallographic information from the workpiece after the workpiece undergoes a fabrication step by the first subsystem and then provides information, based on the crystallographic information acquired, for modifying parameters associated with the respective fabrication steps. The system may also include neural networks (24, 28) to adaptively modify, based on historical process data (32), parameters provided to the respective fabrication steps. The analysis subsystem may include a electromagnetic source (61), a detector (66), a processor (67), a controller (68) and a scanning actuator (65).

21 Claims, 7 Drawing Sheets

MONITORING AND CONTROL OF A FABRICATION PROCESS

This application claims the benefit of the Feb. 22, 2002, filing date of U.S. provisional patent application No. 60/359,222 incorporated herein by reference.

FIELD OF THE INVENTION

The present invention relates to a fabrication process, and, more particularly, to crystallographic metrology and process control for a fabrication process.

BACKGROUND OF THE INVENTION

In the manufacture of many materials, crystallographic features, such as crystallographic orientation, grain size and grain morphology of the material, play an important role in determining the quality and characteristics of the resultant materials. For example, in a metal fabrication process, samples can be taken from the metal at a step in the metal fabrication process and examined, such as by using a microscope, to characterize the crystallography of the sample. Using statistical techniques, the overall quality of the process can be determined by comparing the samples' crystallography to a desired crystallography. However, such conventional techniques usually require destructive sampling of the manufactured metal, and are generally performed "off-line", that is, they are performed separately from the fabrication process and the results of the sampling are generally not used to concurrently control an ongoing process. The information derived from the crystallography of the samples is applied to another fabrication batch.

In another example, some of the primary concerns in the manufacture of semiconductor devices are the mechanical and electrical properties of the metallization used to carry electrons within the semiconductor device. As the fabrication technology of semiconductors becomes more sophisticated, the physical properties of the materials used in semiconductor device, such as the complexity of preferred orientations of polycrystalline microstructures, becomes increasingly important. Crystallographic orientation, grain size and grain morphology play major roles in the reliability, quality assurance, electrical migration resistance, electrical properties, chemical-mechanical polishing (CMP) removal rates, and CMP endpoint detectability.

The crystallographic microstructure of material in a fabrication process can be examined with a variety of techniques including multiphase two-dimensional mapping of crystallographic and morphological data provides challenges to determine the crystallographic grain orientation, grain size and grain boundaries of a workpiece. There are many types of both optical and electron-based metrology tools available for this analysis, including scanning electron microscopes, focused ion beam microscopes, focused x-ray microscopes and focused optical microscopes including near-field scanning optical microscopes. The critical dimension scanning electron microscope (CD-SEM) utilizes algorithms based upon the intensity of line scan profiles of images to extract the apparent width of surface features. Another technique for nondestructively examining microelectronics devices is scanning probe microscopy (SPM) wherein a probe tip is used to study the surface topography or properties of the surface of a substrate. SPM tools include the atomic force microscope (AFM) and the stylus nanoprofilometer (SNP). Furthermore, scatterometers, such as ellipsometers, have been proposed for obtaining high speed two dimensional topographic information. Accordingly, there are numerous ways of obtaining this information, but each of the methods presents slightly different information and may not be suitable for providing process control in near real time manner concurrently with a fabrication process.

Grains within polycrystalline materials generally have orientations that vary from grain to grain. This variation, when considered over a bulk specimen area, can lead to the directional grouping of specific crystalline planes with respect to certain crystallographic axes. The "preferred orientation" of a workpiece refers to an average, or overall, orientation of the grains. The complexity of the preferred orientation of polycrystalline microstructures can be examined with a technique known as Orientation Imaging Microscopy, which analyzes collections of electron backscattering diffraction patterns. This technique combines the advantages of point orientation in Transmission Electron Microscopy (TEM) with morphological information over a large enough area to provide statistical relevance. However, this technique is prohibitively time consuming and does not lend itself to analysis of a metal process in a near real time environment to allow concurrent control of the process.

The foregoing meteorological techniques are typically conducted off-line, i.e., by taking partially fabricated structures in fabrication, including semiconductor devices, out of the fabrication sequence. It is believed that "inline," analysis techniques (that is, a concurrent analysis step that can monitor and control a process while the process is continuing) that identify either grain size or preferred orientation of polycrystalline films do not currently exist in the art. For example, in the case of semiconductors, the devices are typically destructively measured offline by time consuming techniques of electron diffraction and x-ray diffraction. The disadvantage of these offline techniques is that they require constant monitoring on test structures and wafers, which results in a window between when problems occur and when problems are detected. While it is known to apply a neural network to fabrication systems to provide a degree of in-process control for an etch process (see, for example, U.S. Pat. No. 5,653,894 issued to Ibbotson, et al., and U.S. Pat. No. 5,737,496 issued to Frye, et al.), further improvements are desired.

Therefore an improved, inline method and system for monitoring and control of a fabrication process is needed.

SUMMARY OF THE INVENTION

A system for monitoring and controlling a fabrication process is herein described as including: a number of fabrication subsystems that perform respective fabrication steps on a workpiece; and a crystallographic analysis subsystem for acquiring crystallographic information from the workpiece after the workpiece undergoes a fabrication step by at least a first subsystem wherein the crystallographic analysis subsystem is coupled to one or more of the fabrication subsystems to provide information for modifying parameters associated with the respective fabrication steps. In addition, the system may also include feed forward and feed back paths for providing control information to the fabrication subsystems.

A method for monitoring and controlling a fabrication process is herein described as including: coupling a plurality of fabrication subsystems that perform respective fabrication steps on a workpiece; acquiring crystallographic information from the workpiece after the workpiece undergoes a fabrication step by at least a first subsystem; and providing information to one or more of the fabrication subsystems for modifying parameters associated with the respective fabrication steps. In addition, the method may include providing, in a feedback path and feed-forward path, information generated in the crystallographic analysis subsystem to a first subsystem and a second subsystem, respectively.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

DETAILED DESCRIPTION OF THE INVENTION

I. Fabrication System

Figure 1:
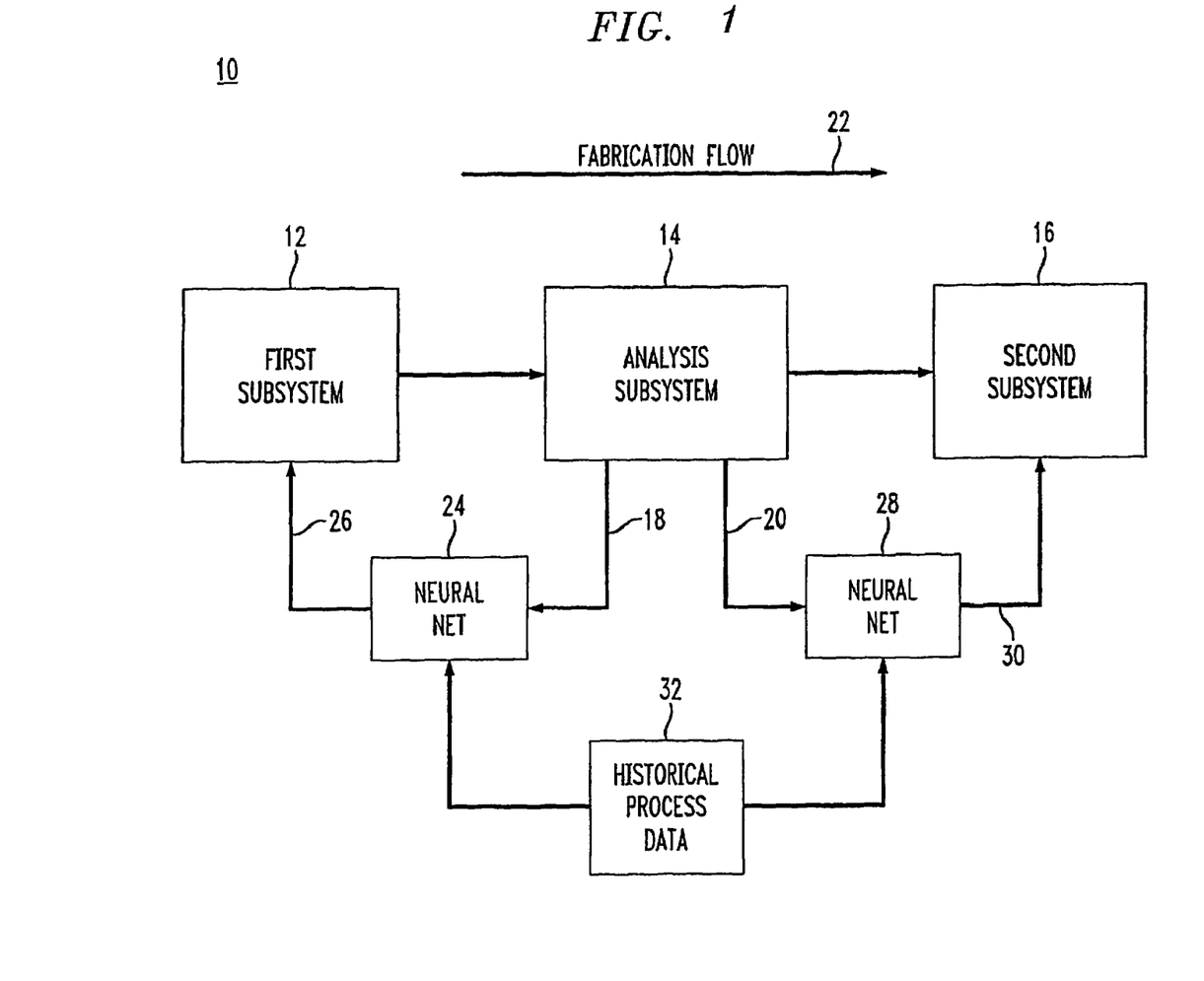
FIG. 1 illustrates a fabrication system having a fabrication flow that may be used to implement a method for monitoring and controlling a fabrication process.

FIG. 1 illustrates a fabrication system 10 having a fabrication flow 22 that may be used to implement a method for monitoring and controlling a fabrication process. In an aspect of the invention, the system provides feed-forward and feedback in-line control of fabrication process based on crystallography measurements of a workpiece being processed. Advantageously, this system integrates an analysis subsystem into a fabrication system to provide near real time analysis and control of the process to reduce overall process time and provide improved control over the workpiece fabrication process. As a result, the system can produce an acceptable end product from a range of input morphologies that is broader than can otherwise be accommodated with prior art feed-back systems. In a further aspect to the invention, neural network algorithms may be provided in the feedback and feed-forward loops to adaptively adjust process parameters of other fabrication subsystems.

As depicted in FIG. 1, a workpiece is first processed through first subsystem 12. The first subsystem 12 may be any known workpiece manufacturing system that lends itself to process control by analysis of the crystallographic properties of the workpiece, such as a semiconductor process or a metal fabrication process. The workpiece is then processed through an analysis subsystem 14 to measure the geometry and quality of the workpiece, such as the crystalline structure of a workpiece. While only a first subsystem 12 is depicted in the fabrication flow 22 before processing the workpiece in the analysis subsystem 14, it should be understood that many subsystems may process the workpiece before arriving at the analysis subsystem 14. The inline analysis subsystem 14 may be any known apparatus or technique, and may include developing a crystallography characterization of the workpiece using atomic force microscopy, surface reflectivity, x-ray diffraction/reflectivity, transmission electron microscopy (TEM), scanning electron microscopy (SEM) or focused ion beam (FIB) emission.

In the embodiment of FIG. 1, the analysis subsystem 14 may provide a multiple parameter characterization of the workpiece 18 as a feedback signal to the first subsystem 12, or any other subsystems in the fabrication flow before the analysis subsystem 14. For example, to control the metal deposition in a semiconductor process, RF power, gas flow and other controllable parameters of the metal deposition process may be controlled via feedback from the analysis subsystem 14. In another aspect of the invention, the multiple parameter characterization of a workpiece 18 may be provided as an input to a feedback neural network 24. The feedback neural network 24 may be trained by either self-organization or by supervised learning to provide feedback control signals 26 to adaptively adjust parameters in the first subsystem 12. In addition, feedback neural network 24 may be provided with historical process data 32 for the deposition process. Feedback neural network 24 is designed to find a mapping from multiple parameter characterization of a workpiece 18 to parameters to achieve, for example, uniform crystal orientation by deposition on wafers in metal deposition process according to a respective crystallography of the wafer determined in the inline metrology element. A neural network is advantageously used to define the relationship between the multiple parameter characterization of a workpiece 18 and, for example, an RF power used in the metal deposition process, since the amount of data available regarding the relationship between these two variables may be limited, and the level of understanding of that relationship may also be limited. As experience is added to the historical database 32 by the processing of workpieces through system 10, the precision of this mapping operation will correspondingly improve.

After inspection in the analysis subsystem 14, workpieces may then be processed in a second subsystem 16, for example, any known chemical mechanical process (CMP) for semiconductors. While only a second subsystem 12 is depicted in the fabrication flow 22 after processing the workpiece in the analysis subsystem 14, it should be understood that many subsystems may process the workpiece after being analyzed in the analysis subsystem 14. A multiple parameter characterization of a workpiece 20 may be provided in feed forward loop to the second subsystem 16, or in another aspect of the invention, as an input to a feed-forward neural network 28 in a feed-forward information path. The feed-forward neural network 28 then provides a feed-forward control signal 30 to adaptively adjust parameters provided to the second subsystem 16, such as amount of polishing chemical used, removal rate curves, and other adjustable parameters used in a CMP process. In addition, feedback neural network 24 may be provided with historical process data 32 for the fabrication process. Feed forward neural network 28 is designed to find a mapping from multiple parameter characterization of a wafer surface 22 to parameters to achieve, for example uniform polishing of wafers according to a respective crystallography of the wafer determined in the inline metrology element. A neural network is advantageously used to define the relationship between the multiple parameter characterization of a wafer surface 22 and, for example, CMP removal rate curves, since the amount of data available regarding the relationship between these two variables may be limited, and the level of understanding of that relationship may also be limited. As experience is added to the historical database 32 by the processing of workpieces through system 10, the precision of this mapping operation will correspondingly improve.

Figure 2:
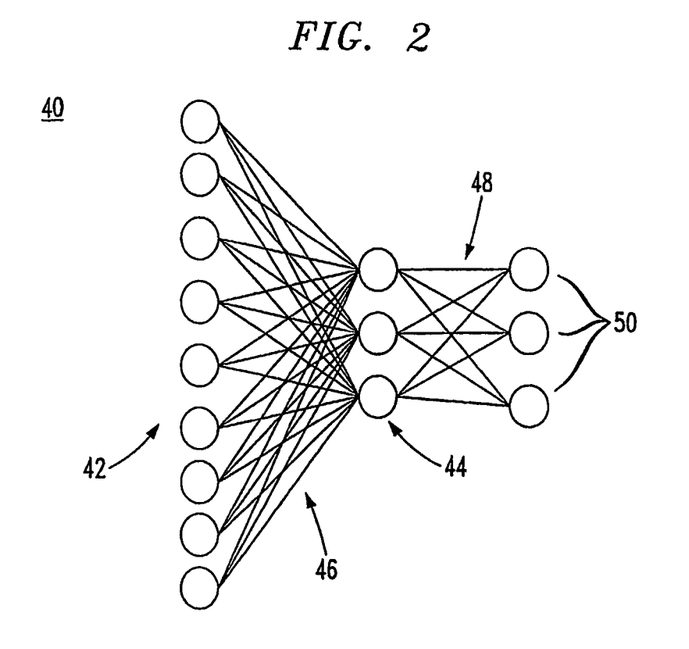
FIG. 2 is a schematic representation of a self-organized neural network.

Neural networks 24, 28 may be trained by any method known in the art, including by a self-organized learning algorithm of the type described in Kohonen, T., Self-organization and Associative Memory, Springer-Verlag, Berlin (1984). The Kohonen algorithm is just one of many self-organization algorithms (also known as competitive learning) that have been reviewed by Ballard, D. H. (1997), An Introduction to Natural Computation, MIT Press, Cambridge, Mass. and by Hassoun, M. H. (1995), Fundamentals of Artificial Neural Networks, MIT Press, Cambridge, Mass. A self-organized network 40 having input nodes 42 is illustrated in FIG. 2 and may be trained as follows. Assume the input vector is the multiple parameter characterization of a wafer surface 22. Let this vector be represented by the symbol M and let the output from the classification nodes 44 be represented by the symbol Y, and W will represent the connection matrix 46 between the input 42 and the classification nodes 44. The value for any given element in the Y vector is given by:

$$y_j = f\left(\sum_i W_{ij} x_i\right) \quad [1]$$

If one starts with small positive random numbers in the connection matrix W, then each classifier node will produce the same output value for the same input vector. The function f could be a simple logistic function, for example:

$$f(z) = \frac{1}{(1 + \exp(-z))} \quad [2]$$

With this algorithm one of the output vector elements will have a greater value than the others (e.g. $y_1 < y_2$ $y_1 < y_3$ $y_2 > y_3$). One may exploit the differences between the individual output vector elements for computational purposes by increasing or decreasing their values. In the example described, the second element is the largest value or the winner. But it is not necessary to determine explicitly which value is the largest or which is the smallest. One may simply use the following algorithm to update the weights between the input nodes and the classification nodes.

$$W_{ij}(t+1) = W_{ij}(t) + \delta W_{ij} x_i \quad [3]$$

The advantage of this algorithm is that there is no need to explicitly examine the classifier output. To determine if the network self-organization has converged, one may simply monitor the magnitude of the changes taking place in the connection matrix 46.

After training the network, one may find that the actual outputs for the classifier nodes are not as strong as preferred, but that they are differentiated from each other. It is possible to further enhance this difference by using a winner-take-all network 48 on the back-end of the self-organizing classifier. This can be done by using simple "If" statements to select the largest output, or by a MAX(y) function to arrive at output nodes 50. At this stage, the system 10 of FIG. 1 will provide a goodness class from the network and this represents, for example, the quality of the multiple parameter characterization of a wafer surface 22

Figure 3:
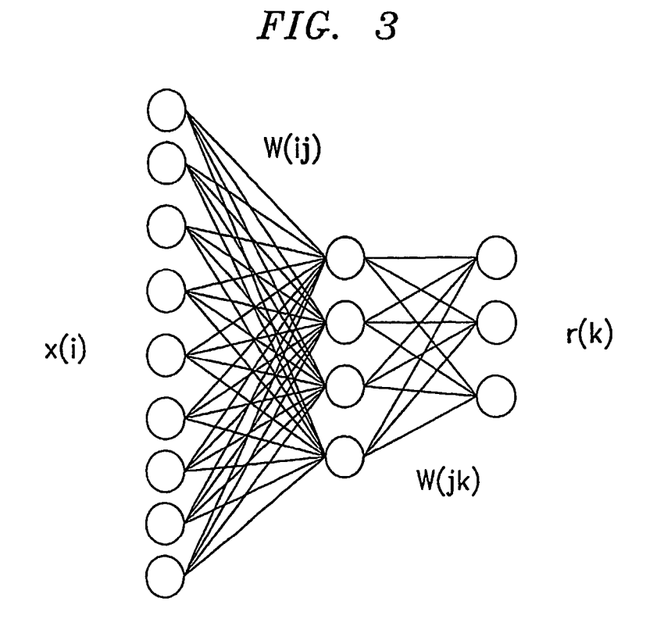
FIG. 3 is a schematic representation of supervised neural network architecture.

There may be and preferably are similarities in training the feedback neural network 24 and the feed-forward neural network 28. A supervised learning algorithm known as the back-propagation of errors can train both. This algorithm is well known in the art with many published papers describing it and its applications. Two published sources for the algorithm are Hassoun, M. H., Fundamentals of Artificial Neural Networks, MIT Press, Cambridge, Mass. (1995) and Reed, R. D. and Marks, II, R. J., Neural Smithing—Supervised Learning in Feedforward Artificial Neural Networks, MIT Press, Cambridge (1999). The following is a brief description of the training algorithm and how it may be applied to the present invention, as illustrated in FIG. 3.

The output of a neural network, r, is given by $$r_k = \sum_j \left[ W_{jk} \cdot \tanh\left(\sum_i W_{ij} \cdot x_i\right) \right]. \quad [4]$$

This equation states that the $i^{th}$ element of the input vector x is multiplied by the connection weights $W_{ij}$. This product is then the argument for a hyperbolic tangent function, which results in another vector. The resulting vector is multiplied by another set of connection weights $W_{jk}$. The subscript i spans the input space. The subscript j spans the space of "hidden nodes", and the subscript k spans the output space. The connection weights are elements of matrices, and are found by gradient search of the error space with respect to the matrix elements. The cost function for the minimization of the output response error is given by:

$$C = \left[ \sum_j (t - r)^2 \right]^{1/2} + \gamma \|W\|^2 \quad [5]$$

The first term represents the RMS error between the target t and the response r. The second term is a constraint that minimizes the magnitude of the connection weights, W. If $\gamma$ (called the regularization coefficient) is large, it will force the weights to take on small magnitude values. This can cause the output response to have a low variance, and the model to take on a linear behavior. With this weight constraint, the cost function will try to minimize the error and force this error to the best optimal between all the training examples. The effect is to strongly bias the network. The coefficient $\gamma$ thus acts as an adjustable parameter for the desired degree of the non-linearity in the model.

In order to apply this technique to training the feed forward neural network 28, for example, we use the multiple parameter characterization of a workpiece 22 as the input vector X and a CMP removal rate curve, for example, as the output target value T. This discussion is provided for illustration only, and does not limit the application of this invention to other control parameters used in other fabrication processes. After selecting the input vector X and the target value T, the network 28 is then trained using the previously described well known algorithm and/or using the historical process data 32. In this discussion, the objective of network 28 is to compute a CMP removal rate curve for running a CMP process. The input to the neural network 28 is the multiple parameter characterization of a workpeice 22 and the network 28 will model the process of mapping the multiple parameter characterization of a workpeice 22 to the CMP removal rate curve. As additional data is accumulated, the connections in neural network 28 can be updated as the process changes, thereby helping neural network 28 adapt to real-world changes.

Accordingly, in an exemplary embodiment, system 10 may be used for in-line automation of a semiconductor fabrication process allowing for the selection of a control parameter values that will move a measured workpiece geometry toward a target acceptance range. Such feed-forward and feedback control applies information acquired through in-process metrology to a downstream and an upstream fabrication step, respectively. In an embodiment, the feed-forward and feedback controls are provided to the respective fabrication steps via neural networks having as an input a multiple parameter characterization of the workpiece morphology. This integrated system can adapt to changes in variables that may not be adequately monitored, or whose impact may not be fully appreciated to adjust the process in response to the actual characteristics of the workpiece after being processed in the first subsystem and the desired characteristics of the workpiece after being processed in the first subsystem.

II. Analysis Subsystem Embodiments

As described earlier, the analysis subsystem 14 may include any known apparatus or technique, or combinations of apparatuses of techniques, and may include developing a crystallography characterization of the workpiece using scanning electron microscope (SEM) or a focused ion beam (FIB) inspection data. Advantageously, the invention provides a novel system and method to measure, for example, crystallographic orientation, grain size, and grain morphology at faster speeds than conventionally possible without the need for offline and/or destructive testing. As used herein, area fraction means the fractional percentage of a grain orientation along a polycrystalline material surface relative to a specified direction.

Figure 4:
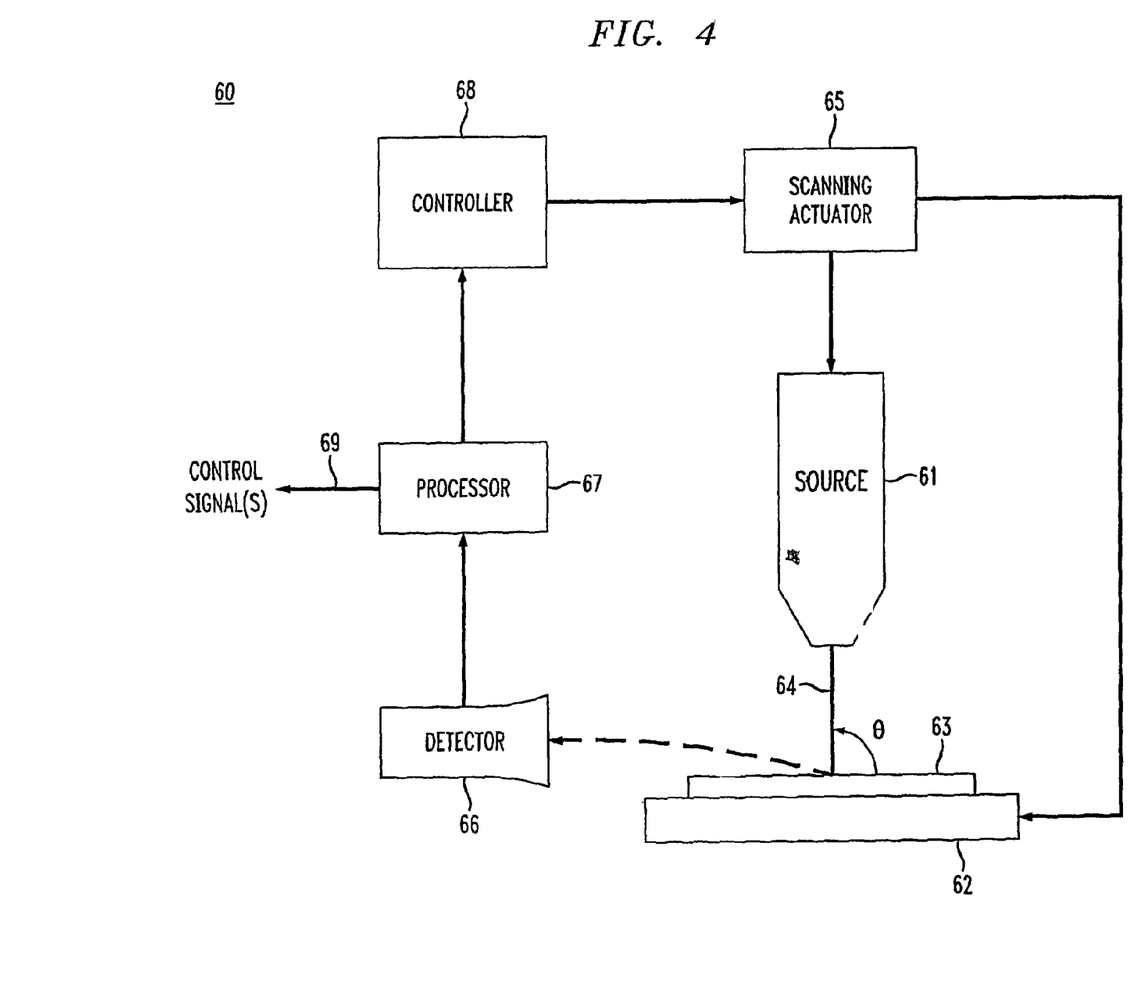
FIG. 4 depicts an embodiment of an analysis subsystem including an electromagnetic source for scanning a workpiece.

FIG. 4 depicts an embodiment of an analysis subsystem including an electromagnetic source 61 for scanning a workpiece. For purposes of this invention, an electromagnetic 16 source can be any source for producing electromagnetic energy including, but not limited to, electron beams, ion beams, x-rays, and optical beams, such as lasers. Generally, the analysis subsystem 60 may include a workpiece holder 62 for holding the workpiece 63 at a glancing angle è to an electromagnetic beam 64. The electron beam 64 is generated by an electromagnetic source 61. A scanning actuator 65 is provided for controlling relative movement between the electromagnetic beam 64 and the workpiece 63 on the workpiece holder 62. The scanning actuator 65 is controllable for directing the electromagnetic beam 64 at areas of the workpiece 63. In other words, the scanning actuator 65 may control movement of the electromagnetic source 61 to move the electromagnetic beam 64 relative to the workpiece 63 on the workpiece holder 62, or the scanning actuator may control movement of the workpiece holder relative to the electromagnetic beam, or both.

A detector 66 is provided to detect electromagnetic emissions, such as diffracted, reflected, or absorbed components, from the workpiece as the electromagnetic beam 64 is scanned over the workpiece 63. The detected emissions are then provided to a processor 67 to characterize the workpiece according to the detected emission correlated to a location of the electron beam 64 impinging the workpiece 63. The processor processes the detected emissions to determine the of the electron beam 64 impinging the workpiece 63, and provides a command to the controller 68 that provides a signal to the scanning actuator to move to another area on the workpiece 63 when the crystallography at the current location has been determined. After sufficient characterization data has been acquired by the processor 67 to characterize the workpiece 63, a control signal 69, comprising multiple parameter characterization of the workpiece, may be provided to subsystems in the fabrication system via feedback or feed-forward paths.

In an aspect of the invention depicted in FIG. 4, roughness of workpiece 63 can be correlated to reflectivity. Accordingly, in a scatterometer embodiment, the source 61 may emit a coherent laser beam which is reflected, or scattered, from the surface and detected by the detector 66 for processing to establish reflectivity of the workpiece 63. It is known that polycrystalline materials having preferred crystal plane orientations grow at different rates for different orientations. As polycrystalline material begins to nucleate and grow on a workpiece surface, a characteristic of the material known as the Gibbs surface energy defines the rate at which a crystalline surface will grow. The Gibbs surface energy is different for different orientations as the orientation of the surface defines the angle of the orbital for binding. For a surface that has a tendency to nucleate and grow in a single direction, such as aluminum, the surface energy with respect to a specific planar location should be relatively equivalent resulting in a fairly uniform surface growth rate. For poly crystalline materials that nucleate out and grow in different orientations, such as tungsten, different surface energies resulting in different growth rates for each of the different polycrystalline orientations. This differential growth rate effectively creates surface roughness that can be monitored through a variety of monitoring techniques such as reflectivity and atomic force microscopy.

The system may employ an optical source for providing a wavelength or wavelengths that would be directed towards a sample surface, a detector for measuring the reflected intensity of said wavelengths. Furthermore, an additional system may employ a physical probe to interrogate the sample surface by determining the height at a particular point and then further determining said height at each point along a raster pattern.

A. Scanning Electron Microscope (SEM)

Figure 5:
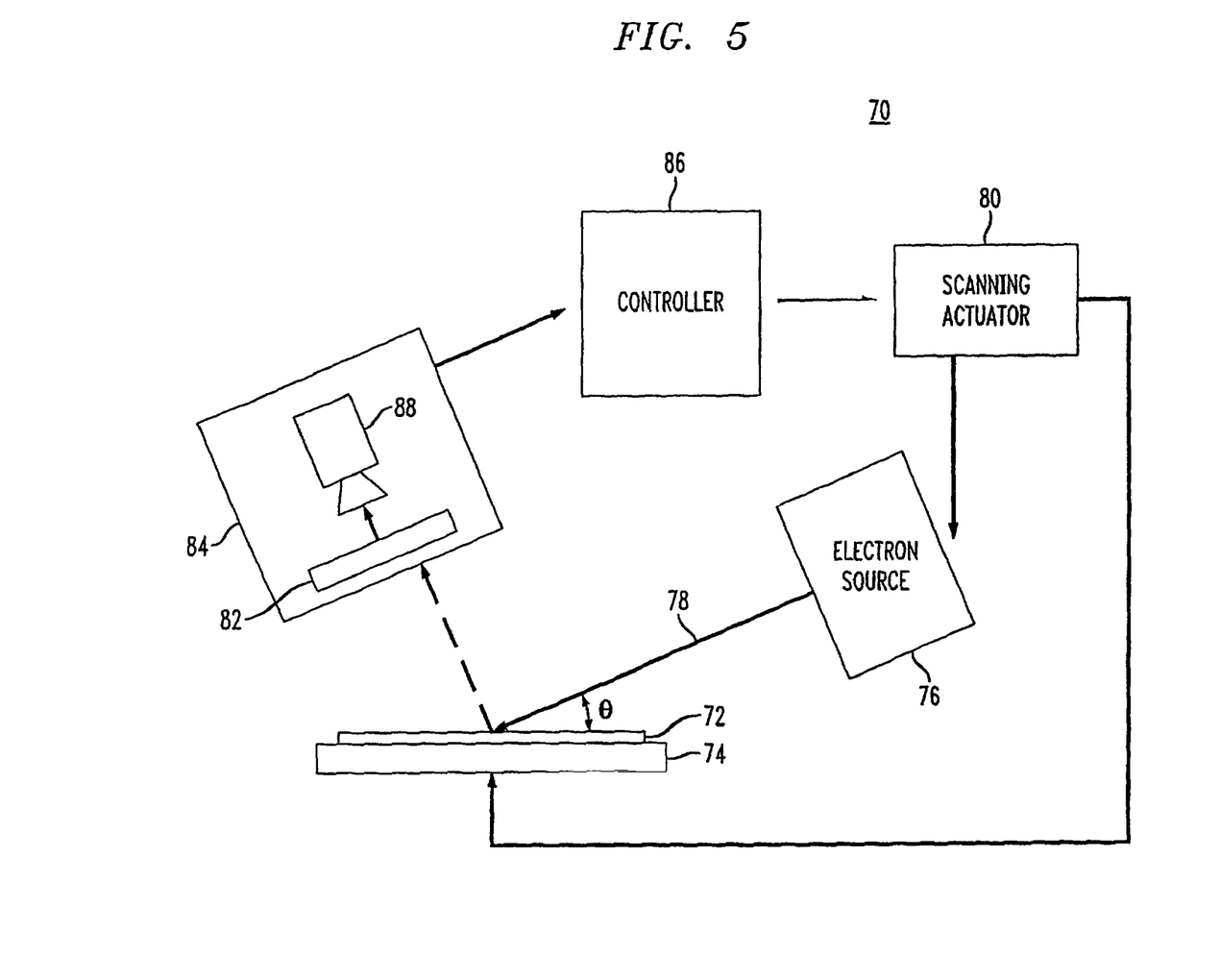
FIG. 5 depicts an embodiment of an analysis subsystem for scanning a workpiece.

Referring now to FIG. 5, an embodiment of an analysis subsystem 70 for scanning a workpiece 72, will now be described. The analysis subsystem 70 includes a workpiece holder 74 for holding the workpiece 72 at a glancing angle θ to an electron beam 78. The electron beam 78 is generated by an electron source 76. A scanning actuator 80 is provided for controlling relative movement between the electron beam 78 and the workpiece 72 on the workpiece holder 74. The scanning actuator 86 is controllable for directing the electron beam 78 at a series of spaced apart points of the workpiece 72. In other words, the scanning actuator 80 may control movement of the electron source 76 to move the electron beam 78 relative to the workpiece 72 on the workpiece holder 74, or the scanning actuator may control movement of the workpiece holder relative to the electron beam, or both.

A processing system, such as an image processor 84, is provided to process images formed on a phosphor screen 82, e.g., by intensifying and/or amplifying the images. The image processor 84 may comprise a low light or charged coupled device (CCD) camera 88 to capture the images. The phosphor screen 82 is mounted adjacent the workpiece holder 74 so that it is parallel to the incident electron beam 78. Diffracted electrons from the workpiece 72 form images on the phosphor screen 82. These images can then be processed to generate crystallographic data based upon electron diffraction from the workpiece 72. In another aspect, the image processor can be configured to determine whether sufficient data have been acquired to characterize the workpiece area The image processor provides a signal toe the controller 86 to controlling the scanning actuator to move the aiming of the electron source 78 to another area of the workpiece 72 when the current area has been processed.

B. Single Focused Electron Beam (FIB)

Figure 6:
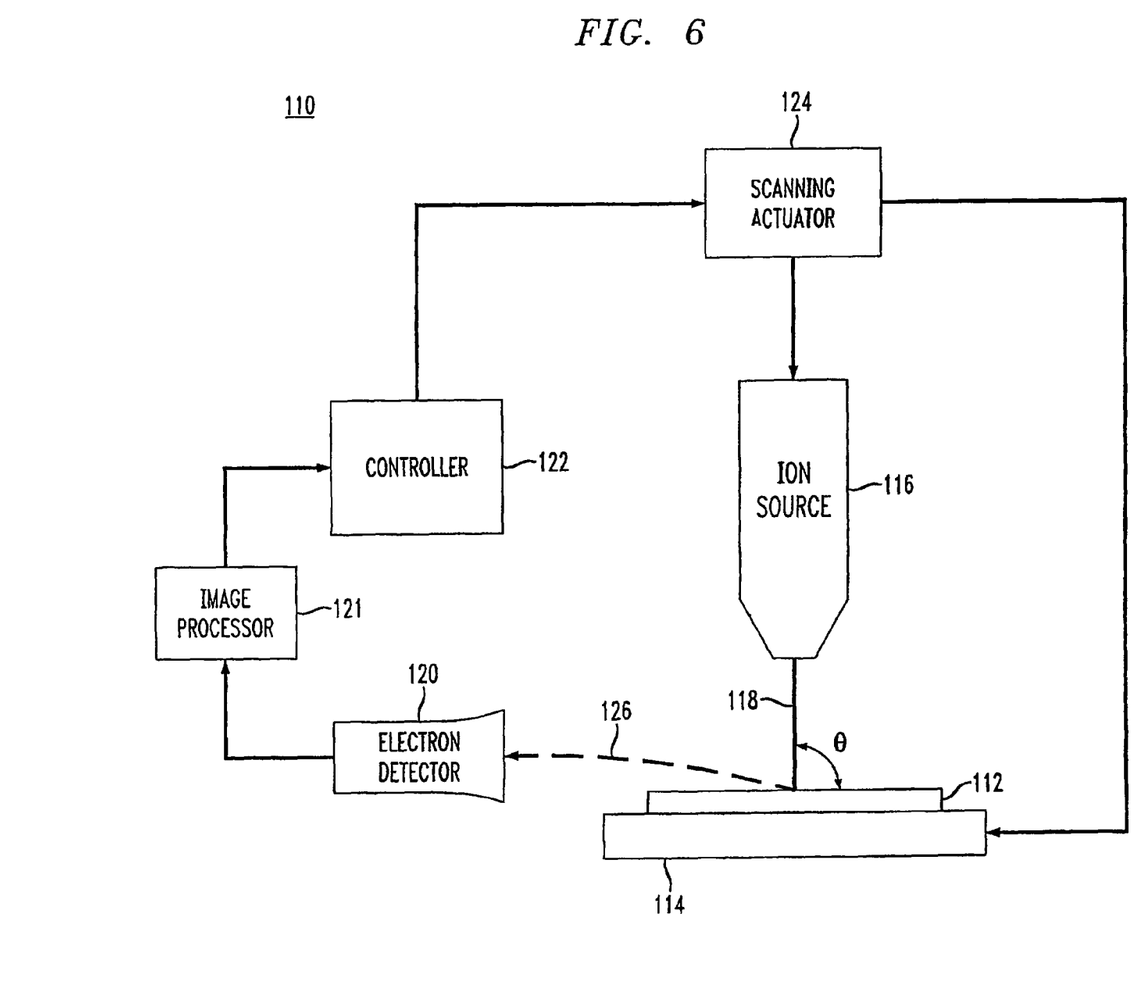
FIG. 6 depicts an ion beam embodiment of an analysis subsystem for scanning a workpiece.

Referring now to FIG. 6, an ion beam embodiment of an analysis subsystem 110 for scanning a workpiece 112, will now be described. The analysis subsystem 110 includes a workpiece holder 114 for holding the workpiece 112 at a glancing angle è to an ion beam 118. In an aspect of the invention, the glancing angle is 90 degrees from the face of the workpiece 112. The ion beam 118 is generated by an ion source 16, such as a focused ion beam (FIB). A scanning actuator 124 is provided for controlling relative movement between the ion beam 118 and the workpiece 112 on the workpiece holder 114. The scanning actuator 124 is controllable for directing the ion beam 118 at selected areas of the workpiece 112. In other words, the scanning actuator 124 may control movement of the ion source 116 to move the ion beam 118 relative to the workpiece 112 on the workpiece holder 114, or the scanning actuator may control movement of the workpiece holder relative to the electron beam, or both. An electron detector 120 is provided to detect electrons 126 emitted from the surface of the workpiece 112 as the ion source 116 scans the ion beam 118 across the workpiece 112. In an aspect of the invention, the electron detector 120 is mounted perpendicular to the ion beam 118 near the edge of workpiece as shown in FIG. 6.

An image processor 121 may be provided to process contrast images received by the electron detector 120, e.g., by intensifying and/or amplifying the images. Once an image has been processed for a specific area, a controller 122 provides a control signal to the scanning actuator 124 to move the ion beam 118, or the workpiece holder, 114 to another desired area of the workpiece 112.

As is known in the art, electron emission from a crystalline material varies according to the statistical likelihood of a collision between an incident ion and a nucleus of a workpiece surface. The closer the distance to the surface where the nucleus impact occurs, the more intense the emission of secondary electrons from the surface. In a crystalline material, the likelihood for collision near the surface is reduced along aligned areas of the crystal structure, or channeling directions. That is, the ion beam penetrates further in a channeling direction than a non-channeling direction.

As the ion beam 118 is scanned across the surface to the workpiece 112, relatively fewer electrons will be emitted from the workpiece 112 when the ion beam 118 intersects a channeling direction, and a relatively greater number of electrons will be emitted when the ion beam intersects non-channeling directions. Therefore, both the orientation of the workpiece 112 with respect to the incident ion beam 118 as well as the channeling directions in the workpiece 112. affect the emission of electrons 126 from the workpiece 112 surface.

Accordingly, as the electron detector 120 detects the electrons 126 emitted from the workpiece 112, the emission intensity is provided to the controller 122 to correlate the emission intensity with a targeted location on the workpiece 112. Using the corrected emission intensity and targeted location information, a contrast map of the sample's 112 corresponding to crystalline channeling areas in the workpiece 112 can be created. The resulting contrast map can be used to determine the crystallographic grain orientation at a point within a scan area of the workpiece 112. In an embodiment of the invention, the contrast map developed using an FIB, for example, can be used to monitor processes and provide process control by taking advantage of the fiber texture nature of semiconductor metals.

C. Dual FIB

Figure 7:
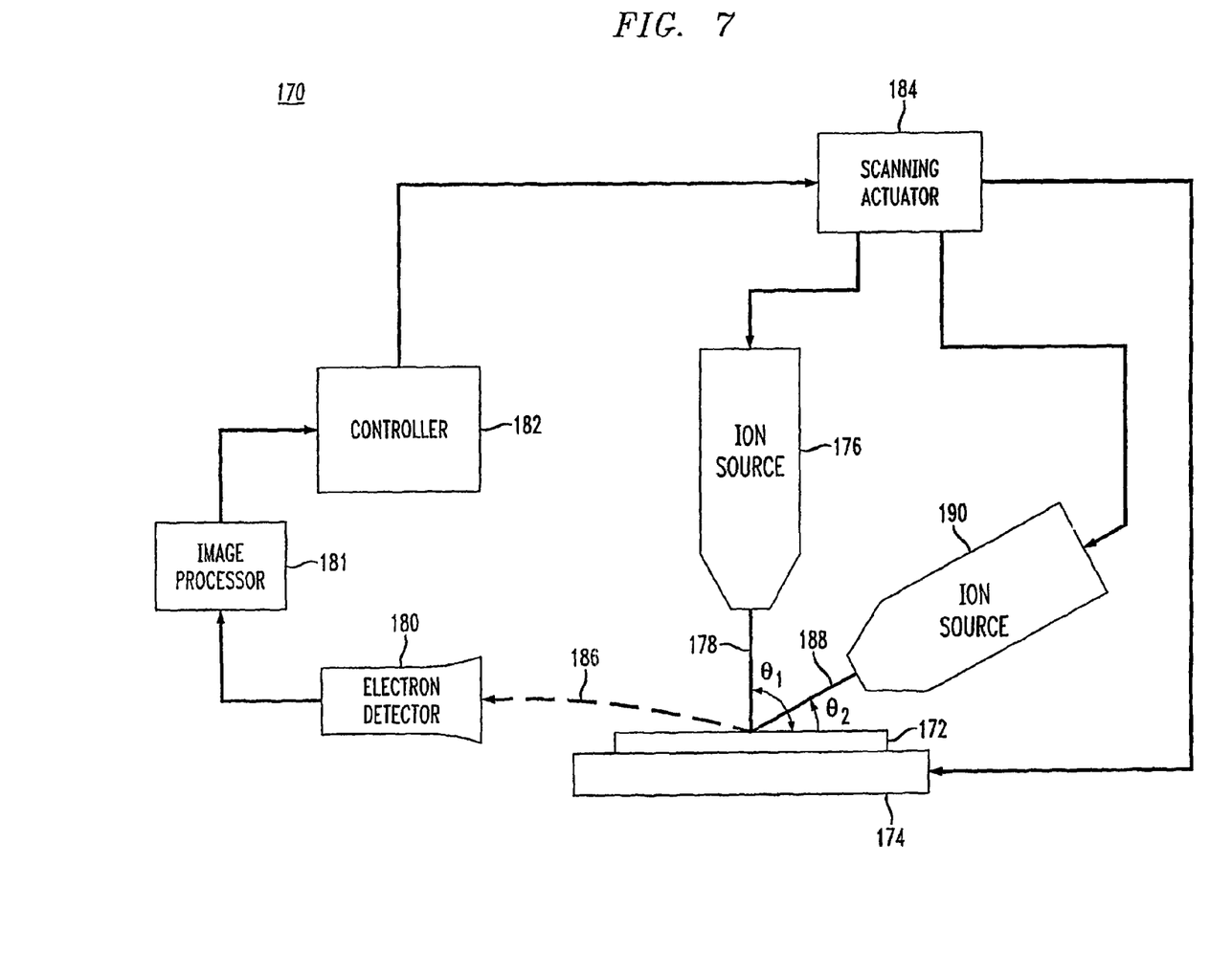
FIG. 7 depicts an embodiment of an analysis subsystem using two ion beams for scanning a workpiece.

Referring now to FIG. 7, a dual ion beam embodiment of an analysis subsystem 170 for scanning a workpiece 172 for on axis and off axis channeling response, will now be described. The analysis subsystem 170 includes a workpiece holder 174 for holding the workpiece 172 at a glancing angle è1, such as an on axis channeling angle, to an ion beam 178, and at a second glancing angle è2, such as an off axis channeling angle, to an ion beam 188. In an aspect of the invention, the glancing angle è1 is 90 degrees from the face of the workpiece 172, while the glancing angle è2 can be varied from 0 to 90 degrees. The ion beams 178, 188 are generated by respective ion sources 176, 190, such as FIB sources. A scanning actuator 184 is provided for controlling relative movement between the ion beams 178, 188 and the workpiece 172 on the workpiece holder 174. The scanning actuator 184 is controllable for directing the ion beams 178, 188 at selected areas of the workpiece 172. In other words, the scanning actuator 184 may control movement of the ion sources 176, 190 to move the ion beams 178, 188 relative to the workpiece 172 on the workpiece holder 174, or the scanning actuator 184 may control movement of the workpiece holder 174 relative to the ion beams 178, 188, or both. In an aspect of the invention, the ion beams 178, 188 are positioned to aim at same spot on the workpiece 172 to provide an on axis and off axis channeling response for the selected spot. An electron detector 180 is provided to detect electrons 186 emitted from the surface of the workpiece 172 as the ion sources 176, 190 scan the respective ion beams 178, 188 across the workpiece 172. In an aspect of the invention, the electron is mounted perpendicular to the ion beam 178 near the edge of workpiece as shown in FIG. 7.

An image processor 181 may be provided to process contrast images received by the electron detector 180, e.g., by intensifying and/or amplifying the images. Once an image has been processed for a specific area, a controller 182 provides a control signal to the scanning actuator 184 to move the ion beams 178, 188, or the workpiece holder 174, to another desired area of the workpiece 172. In an aspect of the invention, the ion sources 176, 190 may be moved in concert to remain aimed at a single desired spot on the workpiece 172, or may be moved independently.

As described above with respect to a single FIB embodiment mounted normal to the workpiece 172, the intensity of the secondary electron emission in workpieces can captured by an electron detector 180 as the ion beams 178, 188 are scanned across the workpiece 172. Accordingly, an ion beam normal to the surface, such as ion beam 178, and on axis with respect to the channeling directions of the workpiece 172 can be used to image grain location. In addition, an ion beam not normal to the wafer surface, such as ion beam 188, and off axis with respect to the channeling directions of the workpiece 172, can be used to image grain size. Therefore, both grain size and grain location of a wafer can be imaged using, for example, a pair of FIB's, to provide inline analysis of a wafer process that can be used to control both a metal deposition process and a CMP process.

D. Combination SEM/FIB

Figure 8:
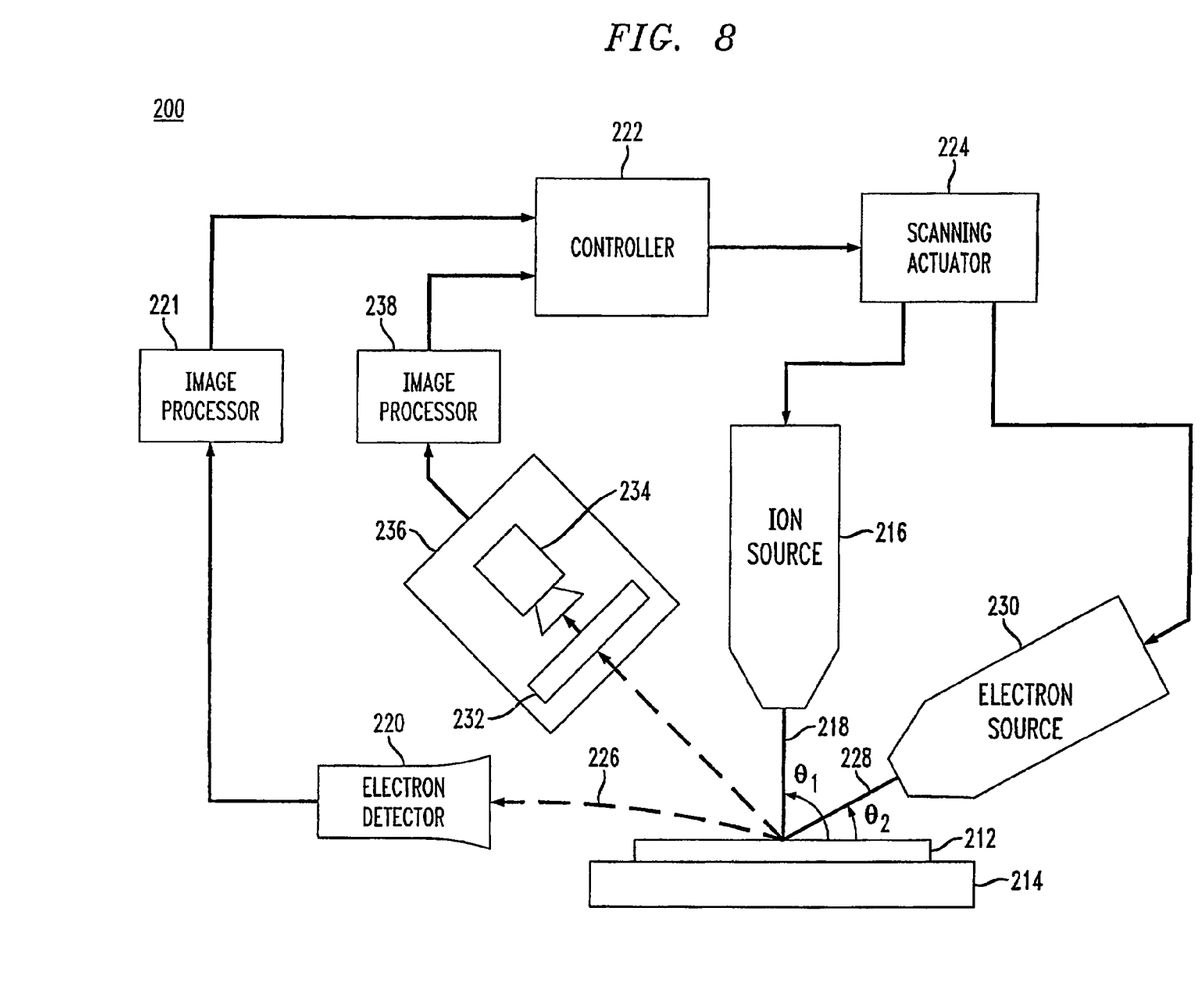
FIG. 8 depicts an analysis subsystem combining and electron source and ion source for scanning a workpiece.

Referring now to FIG. 8, an analysis subsystem 200 combining and electron source 230 and ion source 216 for scanning a workpiece 212, will now be described. The analysis subsystem 210 includes a workpiece holder 214 for holding the workpiece 212 at a glancing angle è1 to an ion beam 218 and glancing angle è2 to an electron source 230. In an aspect of the invention, the glancing angle è1 is 90 degrees from the face of the workpiece 212. In another embodiment, the glancing angle è1 may be an angle between 0 and 90 degrees. The ion beam 218 is generated by an ion source 216, such as a focused ion beam (FIB). A scanning actuator 224 is provided for controlling relative movement between the ion beam 218 and the workpiece 212 on the workpiece holder 214. The scanning actuator 224 is controllable for directing the ion beam 218 at selected areas of the workpiece 212. In other words, the scanning actuator 224 may control movement of the ion source 216 to move the ion beam 218 relative to the workpiece 212 on the workpiece holder 214, or the scanning actuator may control movement of the workpiece holder relative to the electron beam, or both. An electron detector 220 is provided to detect electrons 226 emitted from the surface of the workpiece 212 as the ion source 216 scans the ion beam 218 across the workpiece 212. In an aspect of the invention, the electron detector 220 is mounted perpendicular to the ion beam 18 near the edge of workpiece as shown in FIG. 24.

The electron beam 228 is generated by an electron source 230. A scanning actuator 224 is provided for controlling relative movement between the electron beam 228 and the workpiece 212 on the workpiece holder 14. In an aspect of the invention, glancing angle è2 is 20 degrees. The scanning actuator 224 is controllable for directing the electron beam 228 at the workpiece 212, for example, in a series of spaced apart points of the workpiece 212. In other words, the scanning actuator 224 may control movement of the electron source 216 to move the electron beam 218 relative to the workpiece 212 on the workpiece holder 214, or the scanning actuator may control movement of the workpiece holder relative to the electron beam, or both.

An image processor 236 is provided to process images formed on a phosphor screen 232, e.g., by intensifying and/or amplifying the images. The image processor 236 may comprise a low light or charged coupled device (CCD) camera 234 to capture the images. The phosphor screen 232 is mounted adjacent the workpiece holder 214 so that it is parallel to the incident electron beam 218. Diffracted electrons from the workpiece 212 form images on the phosphor screen 232 as described with respect to FIG. 1. These images are known as Kikuchi diffraction patterns and include Kikuchi bands, which can be used to determine the crystallographic grain orientation at a point within a scan area of the workpiece 212. In addition, another image processor 221 may be provided to process contrast images received by the electron detector 220, e.g., by intensifying and/or amplifying the images. Once an image has been processed for a specific area, a controller 222 provides a control signal to the scanning actuator 224 to move the ion beams 218, or the workpiece holder 214, to another desired area of the workpiece 212. In an aspect of the invention, the ion source 216 and electron source 230 may be moved in concert to remain aimed at a desired single spot on the workpiece 212, or moved independently.

Accordingly, by using both an electron source 230 and an ion source 216 in a dual configuration, efficient crystallographic analysis can be performed. For example, the ion beam can be used for grain identification and an electron beam can be used in point diffraction mode to determine orientation in a crystalline. In an aspect of the invention, the ion beam can be used to grossly determine grain boundary locations, while the electron beam 228 can be used in analytical mode if finer crystallographic analysis, such as by using diffraction patterns, is required.

III. Exemplary Embodiments

Described below are several exemplary embodiments of the invention. However, the present invention is not limited to the following embodiments and can be used in any multi-step fabrication process which may be controlled based on a crystallography or roughness of the workpiece. In one embodiment, the system can be used in a semiconductor manufacturing process comprising a metal deposition step and chemical mechanical processing step. Workpieces, in this case, semiconductor wafers, can be processed in a metal deposition subsystem and then analyzed in an analysis subsystem, such as an inline metrology station, to determine the crystallography of the wafer, before the workpiece is passed to a CMP subsystem. Based on the crystallography determined in the inline metrology station, parameters of the CMP process can be adjusted dynamically to control the process in a feed-forward loop. Similarly, parameters of the deposition process can be controlled in feedback loop from the analysis subsystem.

In another semiconductor fabrication process embodiment, the system may comprise a lithography subsystem, an inline metrology subsystem, and an etch subsystem. The inline metrology subsystem may comprise any of the analysis elements described above to determine a quality of the lithography process by inspection of the wafer. After the wafer is inspected, the wafer is passed to an etch station for etching the desired the pattern. Based on the quality of the lithography, such as height, width, and shape of features, determined in the inline metrology station, parameters of the etch process can be adjusted dynamically to control the process in a feed-forward loop. Similarly, parameters of the lithography process can be controlled in feedback loop from the analysis subsystem.

In a metallurgical application, such as the fabrication of steel and steel alloys, the system can be used to monitor and control the process. For example, the system may include a first subsystem for fabrication of raw stainless steel, an inspection subsystem, and a second, post fabrication subsystem performing, for example, forging, milling or finishing of the fabricated steel. The inspection subsystem may comprise any of the analysis elements described above to determine a quality of the steel produced in the first subsystem. After the steel is inspected in the inspection subsystem, the steel is passed to a second subsystem for performing for example, forging, milling, or finishing. Based on the quality of the steel produced in the first subsystem as determined in the inspection subsystem, parameters of the steel post fabrication process can be adjusted dynamically to control the process in a feed-forward loop. Similarly, parameters of the fabrication process can be controlled in feedback loop from the inspection subsystem.

In a coating application, such as applying coatings to an object or substrate, the system can be used to monitor and control the coating process. For example, the system may include a first subsystem for applying a coating, an inspection subsystem, and a second, post application subsystem, performing, for example, coating finishing operations. The inspection subsystem may comprise any of the analysis elements described above to determine a quality of the coating applied in the first subsystem. After the applied coating is inspected, the coated object or substrate is passed to the second subsystem for further finishing. Based on the quality of the coating produced in the first subsystem as determined in the inspection subsystem, parameters of the steel post application process can be adjusted dynamically to control the process in a feed-forward loop. Similarly, parameters of the coating process can be controlled in feedback loop from the inspection subsystem.

While the preferred embodiments of the present invention have been shown and described herein, it will be obvious that such embodiments are provided by way of example only. Accordingly, it is intended that the invention be limited only by the spirit and scope of the appended claims.

What is claimed is:

1. A system for monitoring and controlling a fabrication process comprising:
   a plurality of fabrication subsystems that perform respective fabrication steps on a workpiece; and
   a crystallographic analysis subsystem for acquiring crystallographic orientation, grain size, or grain morphology from the workpiece after the workpiece undergoes a fabrication step by at least a first subsystem, the crystallographic analysis subsystem coupled to one or more of the fabrication subsystems to provide information for modifying parameters associated with the respective fabrication steps.

2. The system of claim 1, further comprising a feedback path from the crystallographic analysis subsystem to at least the first subsystem for providing information to at least the first subsystem.

3. The system of claim 1, further comprising a feed-forward path from the crystallographic analysis subsystem to at least a second subsystem that performs a fabrication step after the first subsystem and after crystallographic analysis of the workpiece, the feed forward path providing information to at least the second subsystem.

4. The system of claim 1, the analysis subsystem further comprising a workpiece roughness characterization subsystem.

5. The system of claim 1, the analysis subsystem further comprising a workpiece reflectivity characterization subsystem.

6. The system of claim 1, the analysis subsystem further comprising a crystallographic characterization subsystem.

7. The system of claim 6, the crystallographic characterization system further comprising:
   a workpiece holder for holding the workpiece for characterization of a workpiece area;
   an electron source for generating an electron beam;
   a scanning actuator for controlling the relative movement between the electron beam and the workpiece, the scanning actuator being controllable for directing the electron beam at a series of spaced apart points within the workpiece area;
   a first processing system for generating crystallographic data based upon electron diffraction from the workpiece;
   a second processing system configured for determining whether sufficient data have been acquired to characterize the workpiece area; and
   a controller for controlling the scanning actuator to space the points apart such that acquired data is representative of a different grain within the workpiece.

8. The system of claim 6, the crystallographic characterization subsystem further comprising:
   a workpiece holder for holding a crystalline workpiece;
   a first ion source for generating a first ion beam;
   a scanning actuator for controlling the relative movement between the first ion beam and the crystalline workpiece, the scanning actuator being controllable for directing the first ion beam at desired areas of the crystalline workpiece;
   an electron detector for detecting secondary electrons emitted from the crystalline workpiece;
   a first processing system for creating a contrast intensity image based upon secondary electron emissions from the crystalline workpiece;
   a second processing system programmed to provide crystallographic information based on the contrast image intensity data; and
   a controller for controlling the scanning actuator for scanning the first ion beam.

9. The system of claim 8, further comprising a second ion source for generating a second ion beam, the second ion source controllable by the scanning actuator.

10. The system of claim 6, the crystallographic characterization system further comprising:
    a sample holder for holding a crystalline sample;
    a first ion source for generating a first ion beam;
    an electron source for generating an electron beam;
    a scanning actuator for controlling the relative movement between the first ion beam, the electron beam, and the crystalline sample, the scanning actuator being controllable for directing the first ion beam at desired areas of the crystalline sample and for directing the electron beam at a series of points within the sample area;
    an electron detector for detecting secondary electron emissions from the crystalline sample;
    a first processing system for creating a contrast intensity image based upon secondary electron emissions from the crystalline sample and generating crystallographic data based upon electron diffraction from the crystalline sample;
    a second processing system programmed to provide crystallographic information based on the contrast image intensity data and configured for determining whether sufficient data have been acquired to characterize the sample area; and
    a controller for controlling the scanning actuator to direct the first ion beam at desired areas such that each ion channeling image is representative of channeling directions within the crystalline sample and to space the points apart such that acquired data is representative of a different grains within the crystalline sample.

11. A method for monitoring and controlling a fabrication process comprising:
    coupling a plurality of fabrication subsystems that perform respective fabrication steps on a workpiece;
    acquiring crystallographic orientation, grain size, or grain morphology from the workpiece after the workpiece undergoes a fabrication step by at least a first subsystem; and
    providing information to one or more of the fabrication subsystems for modifying parameters associated with the respective fabrication steps.

12. The method of claim 11, further comprising providing, in a feed back path, information generated in the crystallographic analysis subsystem to at least the first subsystem at least the first subsystem.

13. The method of claim 11, further comprising providing, in a feed-forward path, information generated in the crystallographic analysis subsystem to at least a second subsystem that performs a fabrication step after the first subsystem and after crystallographic analysis of the workpiece.

14. The method of claim 11, further comprising characterizing a roughness of a workpiece.

15. The method of claim 14, further comprising:
    measuring the reflectivity in different regions of the workpiece; and
    generating a roughness characteristic based on the measured reflectivity.

16. The method of claim 11, further comprising characterizing a reflectivity of a workpiece.

17. The method of claim 11, further comprising characterizing a crystallography of a workpiece.

18. The method of claim 17, further comprising:
providing a workpiece holder for holding the workpiece for characterization of a workpiece area;
generating an electron beam;
controlling the relative movement between the electron beam and the workpiece for directing the electron beam at a series of spaced apart points within the workpiece area;
generating crystallographic data based upon electron diffraction from the workpiece;
determining whether sufficient data have been acquired to characterize the workpiece area; and
controlling the scanning actuator to space the points apart such that acquired data is representative of a different grain within the workpiece.

19. The method of claim 17, further comprising:
providing a workpiece holder for holding a crystalline workpiece;
generating a first ion beam;
controlling the relative movement between the first ion beam and the crystalline workpiece for directing the first ion beam at desired areas of the crystalline workpiece;
detecting secondary electrons emitted from the crystalline workpiece;
creating a contrast intensity image based upon secondary electron emissions from the crystalline workpiece;
providing crystallographic information based on the contrast image intensity data; and
controlling the scanning actuator for scanning the first ion beam.

20. The method of claim 17, further comprising:
generating a second ion beam; and
controlling the relative movement between the first ion beam, the second ion beam and the crystalline workpiece for directing the second ion beam at desired areas of the crystalline workpiece.

21. The method of claim 17, the crystallographic characterization system further comprising:
providing a sample holder for holding a crystalline sample;
generating a first ion beam;
generating an electron beam;
controlling the relative movement between the first ion beam, the electron beam, and the crystalline sample, the scanning actuator being controllable for directing the first ion beam at desired areas of the crystalline sample and for directing the electron beam at a series of points within the sample area;
detecting secondary electron emissions from the crystalline sample;
creating a contrast intensity image based upon secondary electron emissions from the crystalline sample and generating crystallographic data based upon electron diffraction from the crystalline sample;
providing crystallographic information based on the contrast image intensity data and configured for determining whether sufficient data have been acquired to characterize the sample area; and
controlling the scanning actuator to direct the first ion beam at desired areas such that each ion channeling image is representative of channeling directions within the crystalline sample and to space the points apart such that acquired data is representative of a different grains within the crystalline sample.

* * * * *